(12) United States Patent
Murata et al.

(10) Patent No.: US 6,660,944 B1
(45) Date of Patent: *Dec. 9, 2003

(54) CIRCUIT BOARD HAVING SOLDER BUMPS

(75) Inventors: Haruhiko Murata, Aichi (JP); Yukihiro Kimura, Aichi (JP); Masashi Inaishi, Aichi (JP)

(73) Assignee: NGK Spark Plug Co., Ltd., Nagoya (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 32 days.

(21) Appl. No.: 08/825,400

(22) Filed: Mar. 28, 1997

(30) Foreign Application Priority Data

| Mar. 29, 1996 | (JP) | 8-076960 |
| Apr. 26, 1996 | (JP) | 8-108287 |
| Aug. 12, 1996 | (JP) | 8-212845 |

(51) Int. Cl.[7] .......... H01R 12/04; H05K 1/11
(52) U.S. Cl. .......... 174/261; 174/250; 174/255
(58) Field of Search .......... 228/180.21, 180.22; 174/250, 255, 261

(56) References Cited

U.S. PATENT DOCUMENTS

| 5,217,922 | A | * | 6/1993 | Akasaki et al. .......... 438/125 |
| 5,346,857 | A | * | 9/1994 | Scharr et al. .......... 228/180.22 |
| 5,371,328 | A | * | 12/1994 | Gutierrez et al. .......... 174/261 |
| 5,385,291 | A | * | 1/1995 | Latta .......... 228/180.22 |
| 5,564,617 | A | * | 10/1996 | Degani et al. .......... 228/6.02 |
| 5,587,342 | A | * | 12/1996 | Lin et al. .......... 438/125 |
| 6,419,550 | B2 | * | 7/2002 | Hembree .......... 451/6 |

FOREIGN PATENT DOCUMENTS

| JP | 2-46794 | 2/1990 |
| JP | 2-58229 | 2/1990 |
| JP | 4-037137 | 2/1992 |
| JP | 5-335311 | 12/1993 |
| JP | 2615149 | 3/1997 |

* cited by examiner

Primary Examiner—David L. Talbott
Assistant Examiner—Jeremy Norris
(74) Attorney, Agent, or Firm—Foley & Lardner

(57) ABSTRACT

A circuit board having a plurality of solder bumps is provided. The solder bumps are flattened and leveled at the tops so that the coplanarity of the solder bumps is 0.5 μm or less per 1 mm. The flattened and leveled tops of the solder bumps are formed by cold pressing, hot pressing or grinding. Method of forming such solder bumps and jigs used for carrying out such methods are also provided.

15 Claims, 12 Drawing Sheets

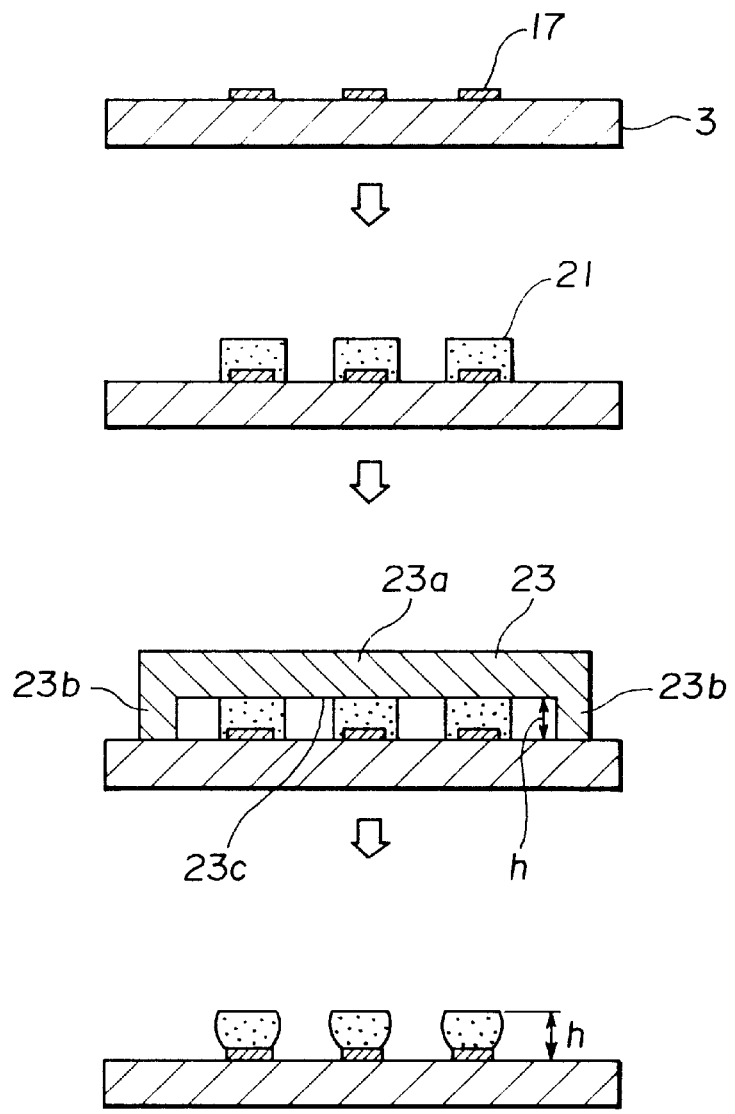
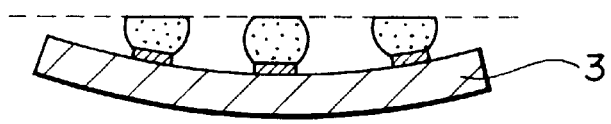

FIG.5
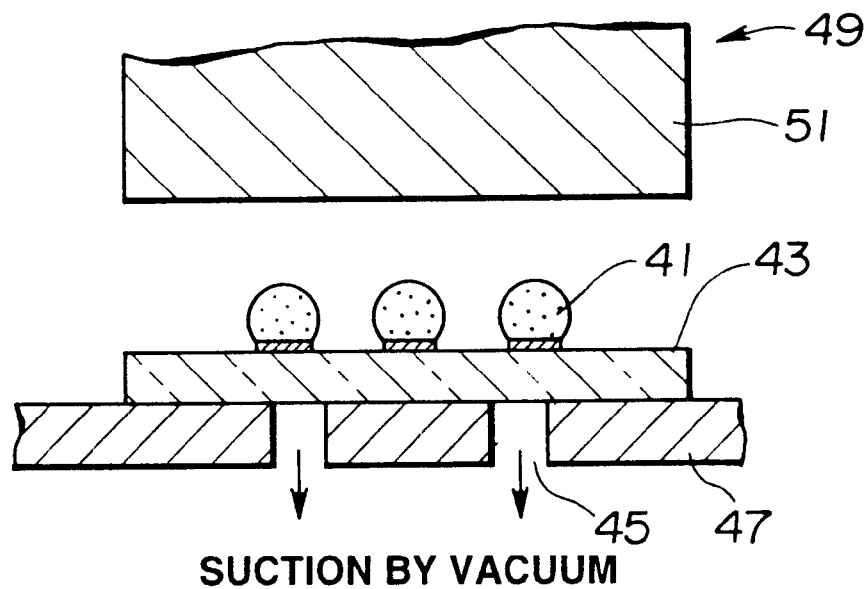
SUCTION BY VACUUM
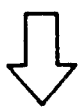
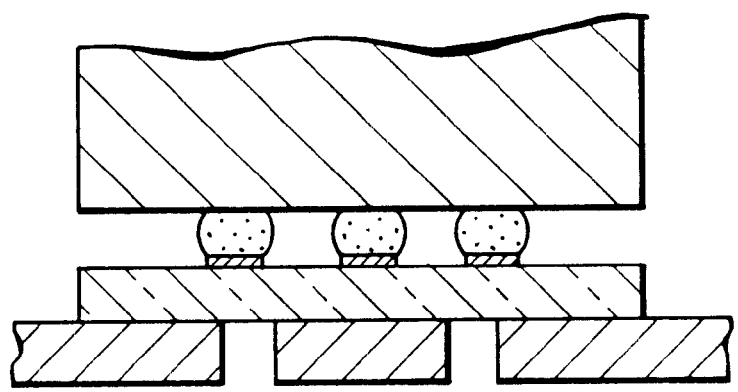

AT THE TIME OF FLATTENING OF SOLDER BUMP

| BUMP HEIGHT | T |
| FLAT PORTION DIA. | 2r |
| BUMP DIA. | 2R |
| PAD DIA. | 2r |
| BUMP VOLUME | S |

AT THE TIME OF REFLOWING OF SOLDER BUMP

| BUMP HEIGHT | L + t |
| BUMP DIA. | 2L |
| PAD DIA. | 2r |
| BUMP VOLUME | S |

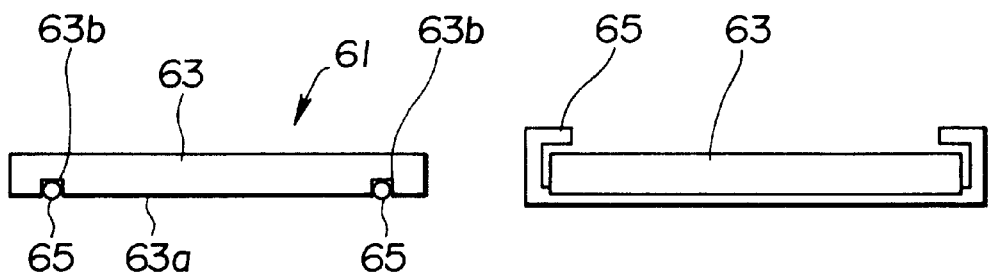
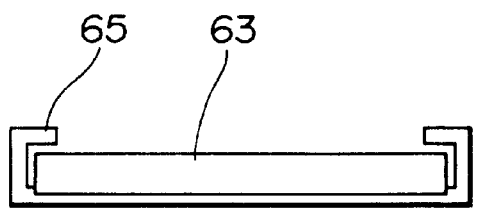
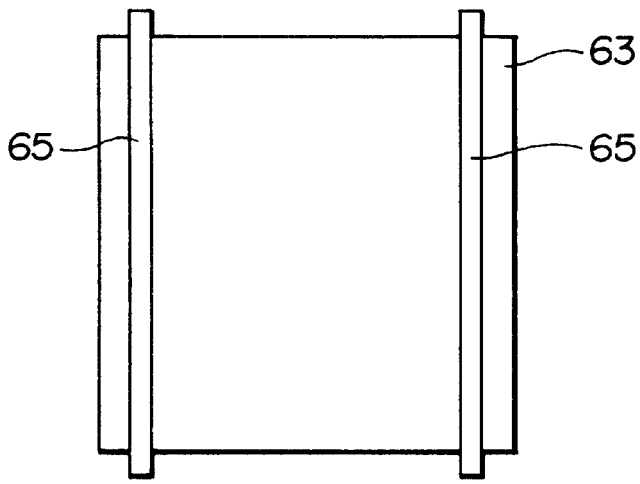

CIRCUIT BOARD HAVING SOLDER BUMPS

BACKGROUND OF THE INVENTION

1. Field of the Invention

The present invention relates to a circuit board having solder balls or bumps such as for flip-chip bonding and ball grid array. Further, the present invention relates to a method of producing such a circuit board. Still further, the present invention relates to a flattening and leveling jig used for carrying out the method.

2. Description of the Related Art

In case of mounting, for example, an integrated circuit chip on an integrated circuit board, it is known to form on their joining surfaces a plurality of terminals of a grid pattern or checkered pattern and bond them by way of the terminals, i.e., a technology that is called flip chip.

Further, it is also known, in case of joining an integrated circuit board having installed thereon an integrated circuit chip to a printed circuit board such as a motherboard, a bonding technology of forming on a back surface of the integrated circuit board (i.e., a joining surface opposite to the front surface on which the integrated circuit chip is installed) a plurality of terminals which are bonding balls of high melting point solder, Cu or the like and arranged so as to form a grid pattern, for thereby bonding the integrated circuit board to the printed circuit board, such a board being called a ball grid array (BGA) board.

Various technologies such as a solder paste technology are known for forming such an integrated circuit board or the like having terminals adapted for surface-to-surface joining and arranged so as to form a grid or checkered pattern.

For example, as shown in FIG. 15A, the solder paste technology includes a process of applying solder paste onto conductive base pads formed on an integrated circuit board by printing and thereafter melting the paste by heating for thereby forming semi-spherical or spherical solder bumps on the pads.

However, forming the solder bumps in the above described manner includes problems described hereinafter and improvement thereof has been eagerly required.

(1) Generally, it has been considered desirable that solder bumps formed on an integrated circuit board are equal in height to each other for the purpose of improving the joining or bonding ability or the like to be joined or bonded to the integrated circuit chip or the printed circuit board. That is, as shown in FIG. 15B, it has been considered desirable that the coplanarity "d" of all of the solder bumps "p" is small.

In this connection, the term "coplanarity" is expressed or represented by the distance "d" between two parallel surfaces S1 and S2 between which the tops or apices of all the solder bumps "p" are included, and is used as an index for indicating the irregularity in the height or level of the solder bumps. In this invention, a coplanarity per unit length, which is obtained by dividing the coplanarity by the maximum distance between the solder bumps (i.e., normally, the diagonal distance of the area in which the solder bumps are formed) since the coplanarity depends on the area in which the solder bumps are formed.

However, the height of each solder bump of itself varies depending upon the volume of solder applied to each pad and the size of the pad, etc., so that a variation in the volume of solder, the size of the pad, etc. causes the solder bumps to become irregular in height. Accordingly, there is caused a problem in that the coplanarity becomes larger. A further problem is that even if the solder bumps are equal in height a large coplanarity results in case the board is warped or curved.

When the coplanarity is large, a joining defect may possibly be caused since the distance between the terminals standing opposite to each other becomes irregular at the time of joining the integrated circuit board to the integrated circuit chip or the printed circuit board. Further, even in case a probe is made to contact respective solder bumps with a view to examining the conduction of the conductors and the insulation between the conductors, it becomes difficult for the probe to contact predetermined solder bumps or all the solder bumps at the same time, so there occurred a case in which accurate measurement could not be obtained.

(2) An image processor is used for measurement of the coplanarity of the solder bumps for the purpose of examining the joining ability of the integrated circuit board but includes a problem in that since the top of the solder bump is constituted by a curved surface it is difficult to detect the highest point or apex of the solder bump and it is inevitable to set at least three points to which a laser beam is irradiated even in the case the highest point (apex) is obtained by approximation, causing a problem in that much labor is required.

SUMMARY OF THE INVENTION

According to an aspect of the present invention, there is provided a circuit board which comprises a substrate having a joining surface, and a plurality of solder bumps disposed on the joining surface of the substrate in such a manner as to form a predetermined profiled line or surface pattern, wherein the solder bumps have tops which are flattened and leveled, and a coplanarity of the solder bumps is 0.5 $\mu$m or less per 1 mm. In this connection, the term "solder" is herein used to mean or indicate Pb—Sn based soft solder and other low melting point solders in a broad sense, such as Au—Sn solder, Au—Si solder, etc. Further, the term "circuit board" is intended to indicate not only (1) a board on which an integrated circuit chip is mounted but (2) a board to be joined with a printed circuit board and (3) an integrated circuit chip of itself (i.e., flip chip). More specifically, indicated by that term are (1) a board having, at one side surface thereof, a plurality of solder bumps for joining to an integrated circuit chip or chips (flip chip bonding), (2) a board having, at one side surface thereof, a plurality of solder bumps (usually, BGA), for joining to a printed circuit board, and (3) an integrated circuit chip having a plurality of solder bumps. The above described profiled line pattern is for example a square frame-like pattern. The profiled surface pattern is for example a grid pattern or checkered pattern.

According to a further aspect of the present invention, circular pads are interposed between the solder bumps and the substrate to serve as base layers of the solder bumps.

According to a further aspect of the present invention, the tops of the solder bumps have nearly circular flat surfaces which are smaller in diameter than the pads.

According to a further aspect of the present invention, the tops of the solder bumps have nearly circular flat surfaces which are substantially equal in diameter to the pads, and the height of the solder bumps is smaller than the diameter of the pads.

According to a further aspect of the present invention, there is provided a method of producing a circuit board including a substrate having a joining surface, and a plurality of solder bumps disposed on the joining surface of the substrate in such a manner as to form a predetermined pattern, wherein the solder bumps have tops which are flat and leveled, and a coplanarity of the solder bumps is 0.5 μm or less per 1 mm. The method comprises the steps of placing masses of solder on the solder bumps, respectively, disposing a control member in the form of a flat plate at a predetermined position above the masses of solder, and forming the masses of solder into the solder bumps all at once by melting the masses of solder and allowing the control member to control the height of the solder bumps while flattening the tops of the solder bumps all at once. The above described solder material can be solder paste, solder preform, solder ball, one having been already formed into solder bump, or the like. The material for the above described control member can be a metal such as titanium and stainless steel, ceramics such as alumina, silicon nitride and silicon carbide, glass and the like, and such one that is not wetted by solder or has a difficulty in being wetted by solder is suitable therefor. Particularly, ceramics are suitable on the working accuracy and in that its deformation by heat is small. The control member is a member for flattening the tops of the solder bumps while leveling the same, so it is desirable, for example, to provide to the opposite ends of a flat or planar plate with a pair of leg members so as to form an assembly having a U-like cross section since it becomes possible to control or adjust the level of the solder bumps through adjustment of the length or height of the leg members and furthermore the workability is improved. The temperature for melting the above described solder is required only to be equal to or higher than the melting point of the solder bump (i.e., the melting point of the solder) and, for example, can be higher than the melting point by 10 to 40° C.

According to a further aspect of the present invention, in the above described method a plurality of pads are disposed on the joining surface of the substrate in such a manner as to form a predetermined profiled line or surface pattern, and the solder bumps are once formed on the pads, respectively and then pressed in such a manner as to allow the tops to be flattened and leveled. In carrying out the above described pressing, there are two cases, i.e., one in which a pressing portion of a pressing device is heated by a heater and the other in which the pressing portion is no heated. Of those, the case of heating is suitable since excessive stress does not result and solder bumps having smooth outer surface can be formed. In the meantime, in this instance, it is desirable to carry out the pressing in nonoxidizing atmospheres in order to prevent oxidation of the solder due to heating.

According to a further aspect of the present invention, in the above described method a plurality of pads are disposed on the joining surface of the substrate in such a manner as to form a profiled line or surface pattern, and the solder bumps are once formed on the pads, respectively and then ground in such a manner as to allow the tops to be flattened and leveled. As a means for carrying out such grinding, a grinding machine having a rotary grinding wheel, for instance, can be used.

According to a further aspect of the present invention, there is provided a flattening and leveling jig for disposition above solder materials mounted on a main surface of a circuit board for controlling the height of solder bumps into which masses of solder are formed by being heated and molten. The jig comprises a control member having a planar surface for controlling the height of the solder bumps, and a pair of leg members which are independent parts and disposed on the side of the planar surface of the control member for support of the control member and for positioning of the planar surface. The material for the above described control member can be a metal such as titanium and stainless steel, ceramics such as alumina, silicon nitride and silicon carbide, glass and the like, and such one that is not wetted by solder or has a difficulty in being wetted by solder is suitable therefor. Particularly, ceramics are suitable on the working accuracy and in that its deformation by heat is small.

According to a further aspect of the present invention, in the above described jig the leg members are so constructed and arranged as to allow the planar surface of the control member to be parallel to the main surface of the substrate when the flattening and leveling jig is disposed in place.

According to a further aspect of the present invention, in the above described jig the leg members are made of wire rod. Such wire rod can be round or square rod.

According to a further aspect of the present invention, in the above described jig the control member has on the side of the planar surface a pair of grooves in which the leg members are fitted.

The above described circuit board, method of producing such a circuit board and a jig used in carrying out the method are useful and effective for solving the above noted problems inherent in the prior art device.

It is accordingly an object of the present invention to provide a novel and improved circuit board having a plurality of solder bumps, which can decrease the coplanarity of the solder bumps assuredly while simplifying measurement of the coplanarity.

It is a further object of the present invention to provide a novel and improved method of producing a circuit board of the foregoing character.

It is a yet further object of the present invention to provide a jig used for carrying out the method of producing a circuit board of the foregoing character.

BRIEF DESCRIPTION OF THE DRAWINGS

FIG. 2A is an illustration of process steps for producing solder bumps;

FIG. 2B is an illustration of an effect obtained by the process of FIG. 2A;

FIG. 5 is an illustration of a process of producing a solder bump according to example 4 of this invention;

FIG. 12A is a sectional view of a flattening and leveling jig according to example 5 of this invention;

FIG. 12B is a bottom plan of the leveling jig of FIG. 12A;

FIG. 12C is a side elevation of the leveling jig of FIG. 12A;

DETAILED DESCRIPTION OF THE PREFERRED EXAMPLES

According to an aspect of the present invention, solder bumps of a circuit board are flattened and leveled. Accordingly, the number of points to which a laser beam is irradiated for measurement of the coplanarity of the circuit board can be reduced (e.g., one point will suffice), and therefore the efficiency of work can be improved considerably.

Further, the process of flatting the tops of the bumps also contributes to decrease of the coplanarity, as will be described hereinafter. For example, in the case a circuit board having solder bumps and an integrated circuit chip or a printed circuit board are disposed so as to stand opposite to each other, the solder bumps are brought completely into contact with the pads or the like of the integrated circuit chip or printed circuit board, or come closer thereto and into a position where the solder bumps and the pads can be soldered. Further, when the solder bumps are reflowed, they are increased in height, i.e., the level of the tops of the solder bumps becomes higher.

Figure 6:
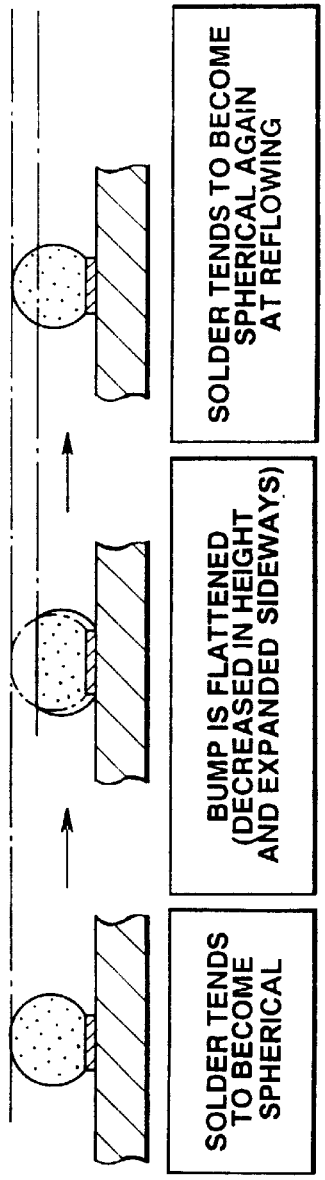
FIG. 6 is an illustration of an effect of this invention, i.e., the solder bump increasing in height at the time of melting.
Figure 7:
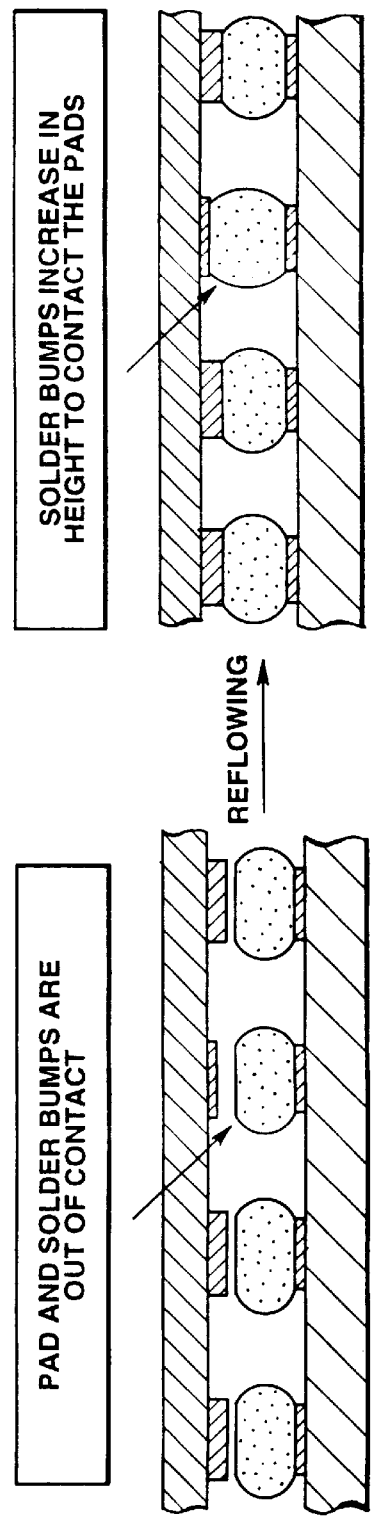
FIG. 7 is an illustration of another effect of this invention, i.e., how the solder bumps are joined to the other of the joining pair.

This is because a mass of solder which tends to become spherical by nature, is pressed down to have a flat or planar portion as shown in FIG. 6, so it tends to become spherical once again when the mass of solder is reflowed at the time of joining and resultantly the solder bumps increase in height.

Accordingly, even when the circuit board of this invention and a mating board (i.e., semiconductor element, motherboard, or the like) are placed one upon another for joining to cause the pads of the mating board and the solder bumps of the circuit board of this invention to be out of contact due to the fact that the coplanarity of the pads of the mating board is so bad, i.e., large, the tops of the solder bumps are caused to go upward or become higher in level and thereby brought into contact with the pads by reflowing the solder bumps at the time of joining, so that a joining defect is hard to occur and an excellent joining ability can be obtained. In the meantime, the coplanarity of the mating board is about 10 $\mu$m in case the mating board is an integrated circuit element and about 100 $\mu$m in case the mating board is a motherboard, so they can be joined assuredly, provided that the solder bumps can increase in height by the amount larger than that coplanarity at the time of joining.

Further, in the case the coplanarity is small, a probe in a conduction or insulation test can contact a predetermined solder bump or bumps, or all of the solder bumps, thus making it possible to carry out the test assuredly.

Description will be made hereinafter with respect to the size and characteristics of the flat or planar portions of the solder bumps.

(1) A larger diameter of the flattened portion is more desired.

This is because at the time of the solder being melted the solder tends to become spherical due to the surface tension, so the larger the flattened portion becomes (i.e., the more the solder bumps is depressed downward or flattened), the more the tops of the solder bumps increase in height at the time of joining in which the solder bumps are reflowed.

Figure 8:
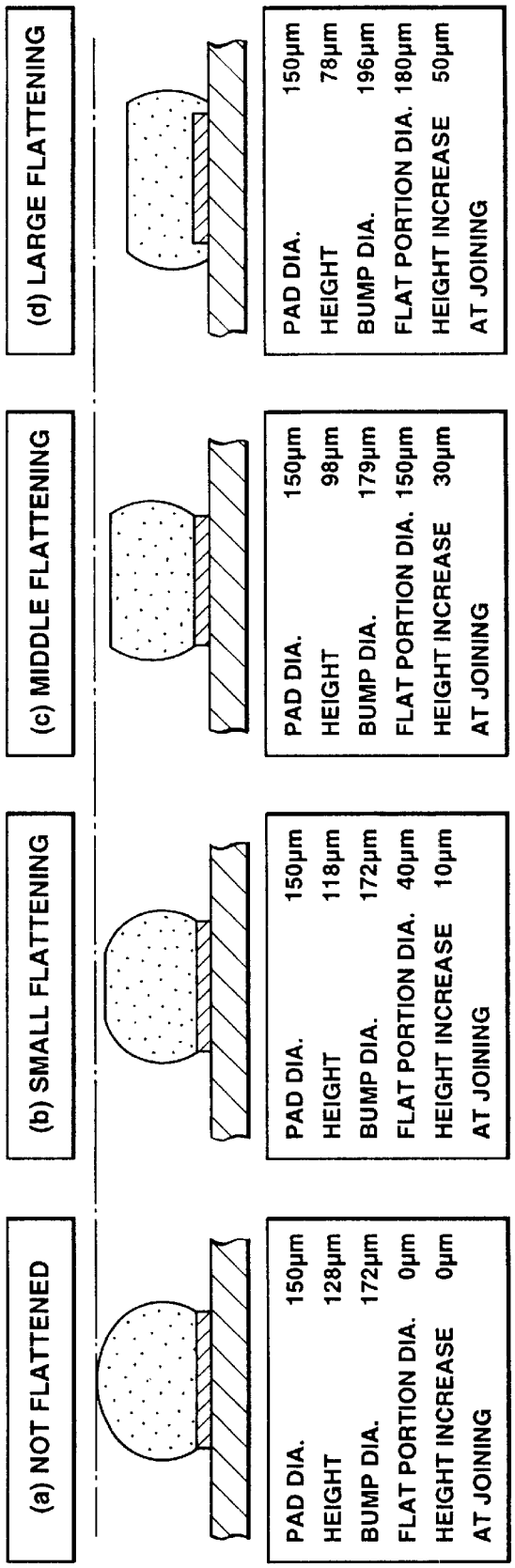
FIG. 8 is a further effect of this invention, i.e., the difference in the flattened degree of the tops of the solders.
Figure 9:
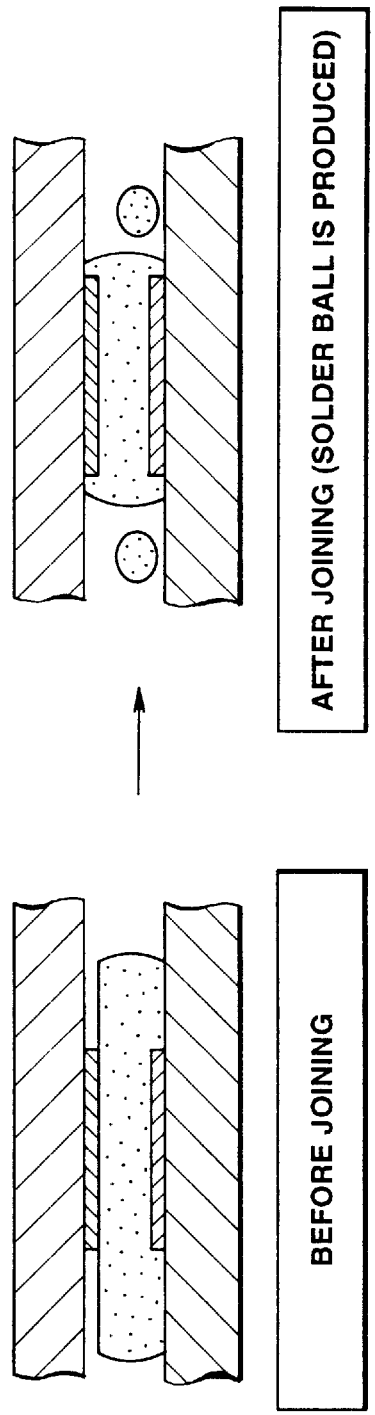
FIG. 9 is an illustration of a further effect of this invention, i.e., how a solder ball is produced.

FIG. 8 shows examples (a), (b) and (c) having various flat tops, i.e., flat tops which differ in the degree of being flattened. As seen from FIG. 8, the solder bump which is flattened more so as to be lower in height, have a larger flattened portion at the top (a<b<c<d). At the time when the solder bumps are reflowed, all the shapes (b), (c) and (d) of the solder bumps in FIG. 8 return to the shape (a), so that the solder bumps (b), (c) and (d) increase in height by the amount different in height from the bump (a) (with respect to increase in height, a<b<c<d). Accordingly, as the flattened portion becomes larger, the tops of the solder bumps go much nearer to the pads or the like of the mating board which is an object to be joined, at the time of joining, so even if the coplanarity of the circuit board of this invention or the surface property of the mating board is bad, their joining can be attained with ease.

(2) The diameter of the flattened portion is desired to be equal to or smaller than the result of the diameter of a solder bump base pad ×1.5.

This is because, as shown in Table 1, when the diameter of the flattened portion becomes larger than 1.5 times as large as the diameter of the solder bump base pad, a part of the solder not located on the pad but bulging out therefrom is separated from the remainder to drop and form a solder ball or balls, so that the resulting solder balls may possibly stick or adhere to the board so as to connect between the pads and deteriorate the insulation ability. In the meantime, in Table 1, the relation between the diameter of the flattened portion of the solder bump and the percentage of solder ball production is shown.

TABLE 1

| Diameter of flattened Portion | Production Rate of solder Ball |
| --- | --- |
| 150 $\mu$m (Pad Dia. × 1.00) | 0/10000 Pads (0%) |
| 188 $\mu$m (Pad Dia. × 1.25) | 0/10000 Pads (0%) |
| 225 $\mu$m (Pad Dia. × 1.50) | 0/10000 Pads (0%) |
| 263 $\mu$m (Pad Dia. × 1.75) | 1000/10000 Pads (10%) |
| 300 $\mu$m (Pad Dia. × 2.00) | 5000/10000 Pads (50%) |

In the Table, the diameter of the solder bump base pad is 150 $\mu$m, and the height of the solder bump is 50 $\mu$m.

(3) The diameter of the flattened portion is desired to be equal to or smaller than the result of pad diameter ×0.5.

Figure 10:
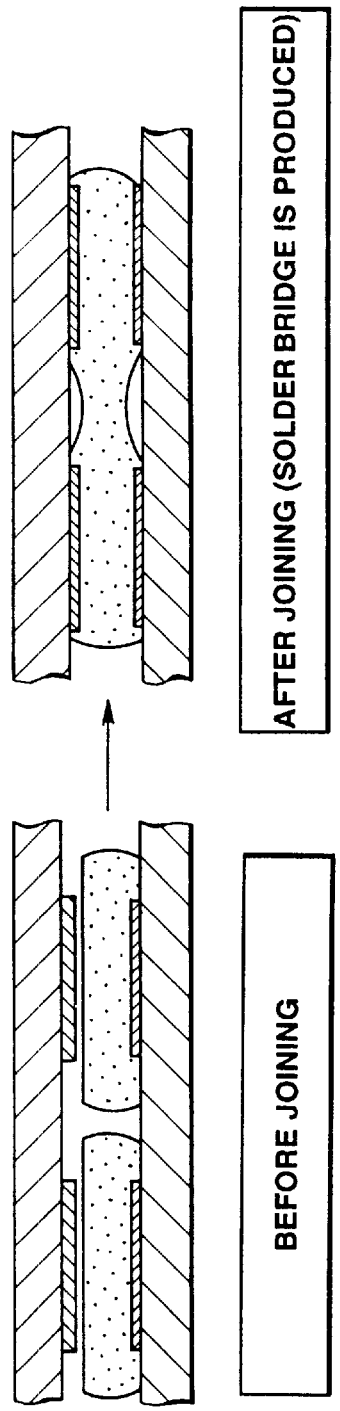
FIG. 10 is an illustration of a further effect of this invention, i.e., how a solder bridge is produced.
Figure 11A:
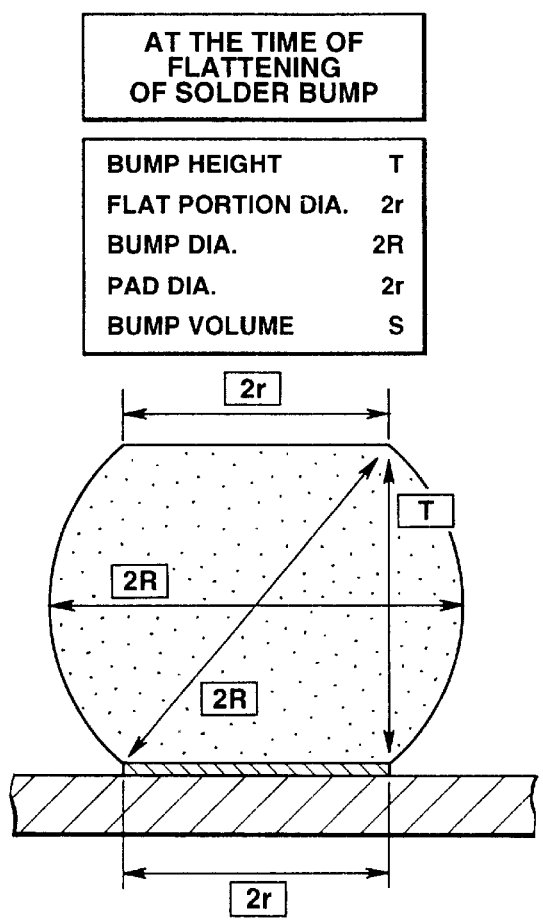
FIGS. 11A and 11B are illustrations of how the volume of a solder bump is calculated.
Figure 11B:
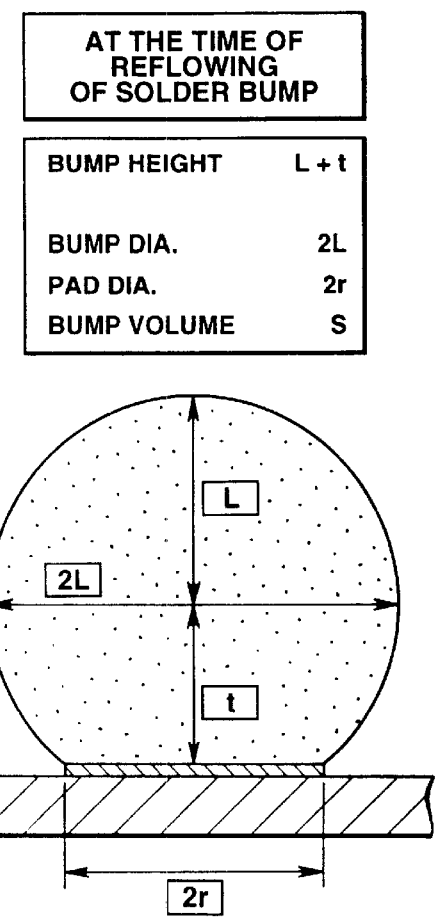
Figure 13A:
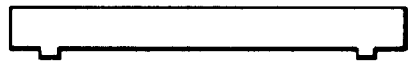
FIG. 13A is an elevation of a flattening and leveling jig according to a comparative example.
Figure 13C:
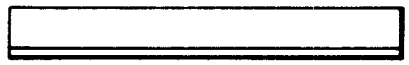
FIG. 13C is a side elevation of the flattening and leveling jig of FIG. 13A.
Figure 13B:
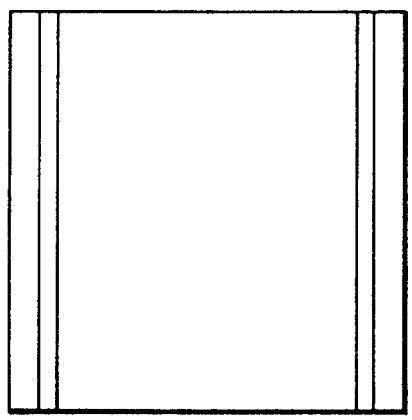
FIG. 13B is a bottom plan view of the flattening and leveling jig of FIG. 13A.

This is because the flattened portion of the solder bump may be protruded radially outward of the solder bump base pad when flattened and have a possibility of developing, when protruded too much, a short circuit between it and the solder bump of its adjacent pad at the time of joining, as shown in Table 2 and in FIG. 10. In the meantime, in Table 2, the relation between the diameter of the flattened portion of the solder bump and the production rate of solder bridge between solder bump base pads at the time of joining is shown.

TABLE 2

| Diameter of flattened Portion | Production Rate of Solder Bridge between pads at the time of joining |
|---|---|
| 150 μm (Pad Dia. + Distance between Pads × 0.0) | 0/1000 Pads (0%) |
| 180 μm (Pad Dia. + Distance between Pads × 0.3) | 0/1000 Pads (0%) |
| 200 μm (Pad Dia. + Distance between Pads × 0.5) | 0/1000 Pads (0%) |
| 220 μm (Pad Dia. + Distance between Pads × 0.7) | 2000/1000 Pads (20%) |
| 250 μm (Pad Dia. + Distance between Pads × 1.0) | Solder Bridge being produced in All of Pads at the time of flattening of Solder Bump |

In Table 2, the diameter of the solder bump base pad is 150 μm, and the height of the solder bump is 50 μm.

(4) The diameter of the flattened portion is desired to be 50 μm or more from a point of view of image processing.

This is because if the flattened portion is so sized as to be equal to or larger than 150 μm in diameter, though the diameter differs depending upon an image processor used, the flattened portion of the solder bump can be recognized assuredly by means of an image processor and the coplanarity can be measured automatically by means of a three-dimensional laser measuring device. The relation between the diameter of the flattened portion of the solder bump and the occurrence rate of error recognized by an image processor is shown in Table 3.

TABLE 3

| | Occurrence Rate of Error recognized by Image Processor | |
|---|---|---|
| Diameter of Flat Portion | Image Processor of Company A's make | Image Processor of Company B's make |
| 20 μm | 100/100 (100%) | 70/100 (70%) |
| 30 μm | 40/100 (40%) | 20/100 (20%) |
| 40 μm | 5/100 (5%) | 0/100 (0%) |
| 50 μm | 0/100 (0%) | 0/100 (0%) |
| 60 μm | 0/100 (0%) | 0/100 (0%) |

In Table 3, the diameter of the solder bump base pad is 150 μm, and the height of the solder bump is 50 μm.

Accordingly, considering that the above described (1) to (4) are allowable limits, it may safely be said that the diameter of the flattened portion is within the range of the pad diameter × (0.5 to 1.2).

More specifically, in the case the pad diameter is 150 μm and the distance between pads is 100 μm, the allowable diameter of the flattened portion is in the range of 50 to 200 μm, and the optimum diameter of the flattened portion is in the range of 75 to 180 μm.

According to another aspect of the present invention, the coplanarity of the solder bumps per 1 mm is set to be 0.5 μm or less, so it becomes possible to join the circuit board of this invention to an integrated circuit chip, printed circuit board or the like favorably while becoming possible to perform a conduction test, insulation test and the like accurately.

Since the coplanarity per 1 mm is set to be 0.5 μm or less according to the present invention, it becomes possible to join, in case of joining the circuit board of this invention to an integrated circuit chip or a printed circuit board such as motherboard, the solder bumps to the pads formed in the mating chip or printed circuit board assuredly.

According to a further aspect of the present invention, the diameter of the flattened portion of the solder bumps is set to be nearly equal to the diameter of the solder bump base pad.

Since the solder bumps are flattened at the top according to the present invention, they tend to become spherical and become higher in level at the tops when heated to reflow, and are thus brought into contact with the mating pads to be joined thereto, even if the tops of the solder bumps should be spaced away from the pads or the like of the integrated circuit or the printed circuit board. Particularly, the solder bump which is pressed down and deformed to such an extent that the flattened top of the diameter nearly equal to the diameter of the solder bump base pad is obtained, can effect large increase in height and is therefore excellent in the joining ability.

In the meantime, if the solder bumps are flattened excessively so that the flattened portion becomes larger in diameter than the bump base pad to bulge out therefrom, there may possibly occur such a case in which the bulged out part of the solder bump is separated from the remainder to form a solder ball or balls and deteriorate the insulation property or to cause a solder bridge or bridges between the adjacent pads to develop a short. However, since the diameter of the flattened portion is set substantially equal to that of the bump base pad according to the present invention, there is not produced any defective circuit board in which a solder ball or solder bridge is caused, and therefore the circuit board of this invention is excellent in the joining ability.

According to a further aspect of the present invention, the diameter of the flattened portion of the solder bump is set nearly equal to that of the solder bump base pad, and the height of the solder bump is set smaller than the diameter of the solder bump base pad.

That is, since the solder bumps are shaped flat at the top according to the present invention, they tend to become spherical and become higher in level at the tops when heated to reflow, and are thus brought into contact with the mating pads to be joined thereto, even if the tops of the solder bumps should be spaced away from the pads or the like of the integrated circuit chip or the printed circuit board. Particularly, the solder bump having a diameter nearly equal to that of the solder bump base pad and the height smaller than the diameter of the solder bump base pad, can effect large increase in height and is therefore excellent in the joining ability. In Table 4, the relation between the height of the solder bump and the increase in height of the solder bump at the time of joining, in case the flattened portion and the solder bump base pad are equal in diameter is shown.

TABLE 4

| Height of Solder Bump | Height of Solder Bump at the time of Reflowing | Increase in Height of Solder Bump at the time of Reflowing |
|---|---|---|
| 50 μm | 80 μm | 30 μm |
| 100 μm | 130 μm | 30 μm |
| 150 μm | 178 μm | 28 μm |

TABLE 4-continued

| Height of Solder Bump | Height of Solder Bump at the time of Reflowing | Increase in Height of Solder Bump at the time of Reflowing |
|---|---|---|
| 200 μm | 223 μm | 23 μm |
| 250 μm | 271 μm | 21 μm |

In Table 4, the diameter of the solder bump base pad is 150 μm, and the diameter of the flattened portion is 150 μm.

If the solder bump is flattened excessively so that the diameter of the flattened portion becomes larger than that of the solder bump base pad to bulge out therefrom too much, there may possible occur such a case in which the bulged-out part of the solder bump is separated from the remainder to form a solder ball or balls to deteriorate the insulation property or a solder bridge or bridges between the adjacent pads to develop a short. However, since the diameter of the flattened portion is set nearly equal to that of the bump solder base pad according to the present invention, there is not produced any defective circuit board in which a solder ball or solder bridge is caused, and therefore the circuit board of this invention is excellent in the joining ability.

The above described solder bump according to the present invention can be formed with ease by setting the amount of solder to be applied to a suitable value (in case of screen printing, it can be set depending upon the opening diameter of the metal mask and its thickness) since the volume of the solder bump can be obtained from the following expression (1), and by flattening the solder bump so that a desired height of the solder bump is obtained. Further, since it can be calculated from the following expressions (1) and (2) how much the height of the solder bump is increased at the time of reflowing of the solder bump for joining, a desired shape of the solder bump can be obtained by calculation depending upon how much the height of the solder bump is required to increase at the time of joining, and therefore an advantage is that the design of product can be attained with ease.

The volume S of the solder bump at the time of flattening is obtained by:

$$S=(r^2 \times T + T^3/6) \times \pi \quad (1)$$

where T=the height of the solder bump and r=½ of the diameter of the flattened portion of the solder bump at the time of joining.

The volume S of the solder bump at the time of reflowing is obtained by:

$$S=(2 \times L^3 + 3 \times L^2 \times t - t^3) \times \pi/3 \quad (2)$$

where $L^2 = r^2 + t^2$, π=the ratio of the circumference of a circle to its diameter, t=the distance between the bottom and the center of the solder bump, L=the diameter of the solder bump at the time of reflow, and r=½ of the diameter of the solder bump base pad.

According to a further aspect of the present invention, after a plurality of masses of solder are placed respectively on a plurality of solder bumps which are disposed on a joining surface of a substrate so as to form a profiled line or surface pattern, a control member is disposed at a predetermined height control position above the masses of solder (i.e., at a position for controlling the height of the solder bumps all at once at the time of melting of the solder) for forming a flat or planar surface which is distant a predetermined amount from the joining surface of the substrate, and the solder masses are formed into the solder bumps which are flat or planar at the tops, by being heated and melted.

That is, since the masses of solder is heated and melted under the condition in which the flat or planar surface of the control member is disposed in such a manner that the height of the masses of solder (i.e., the height of the solder bumps to be formed) does not become larger than a predetermined value and the tops of the solder bumps become flat or planar while the coplanarity becoming smaller.

In this instance, even if the circuit board is slightly curved, such a curvature is absorbed through adjustment of the height of the solder bumps controlled by the flat or planar surface of the control member, so an advantage from this point is that the coplanarity becomes smaller.

Accordingly, by using a jig of a simple structure and by a simple means of performing the flattening at the time of melting of solder, it becomes possible to produce a circuit board having solder bumps which are suitable and desirable for joining, without increasing the number of working steps and requiring equipment investment. Particularly, in the case a jig in the form of a flat plate with legs and having a U-like cross section, the height of the solder bumps is determined by the length or height of the legs, and therefore an advantage is that the work can be done under a stable condition.

Further, though generally the solder is oxidized with ease, melting of the solder is usually carried out in nonoxidizing atmospheres, so the degree of oxidization is small and a high joining ability can be maintained even in the case the solder is reflowed at the time of joining of the circuit board to an integrated circuit chip or printed circuit board.

According to a further aspect of the present invention, a plurality of solder bumps which are flat or planar at the tops are formed by once forming the solder bumps respectively on a plurality of pads which are disposed on a joining surface of a substrate of a circuit board so as to form a profiled line or surface pattern, and then pressing the solder bumps so as to be leveled at the tops.

In carrying out such pressing, there are two cases, i.e., one in which a pressing portion of a pressing device is heated by a heater and the other in which the pressing portion is not heated. Of those, in the case of the pressing portion being heated, the solder is softened and melted, thus preventing generation of excessive stress while restraining oxidation due to stresses caused by pressing, so that it becomes possible to flatten the tops of the solder bumps smoothly. On the other hand, in the case of cold pressing, the heater for heating is unnecessary, so the tops of the solder bumps can be flattened with ease. That is, it becomes possible to produce a circuit board having solder bumps which are suitable for joining by a simple means, i.e., pressing.

According to a further aspect of the present invention, a plurality of solder bumps which are flat or planar at the tops are formed by once forming solder bumps respectively on a plurality of pads which are disposed on a joining surface of a substrate in such a manner as to form a profiled line or surface pattern, and then grinding the solder bumps in such a manner that the tops of the solder bumps are flattened and leveled. That is, only by grinding by means of a grinder or the like grinding machine, it becomes possible to make the tops of the solder bumps flat or planar and it becomes possible to produce a circuit board having solder bumps which are suitable for joining.

In the meantime, whether the flat or planar tops of the solder bumps are produced by melting, pressing or grinding can be distinguished one from the other by inspection of the surface, cross section, etc.

According to a further aspect of the present invention, a flattening and leveling jig has a control member having a flat or planar surface for controlling the height of the solder bumps and a pair of leg members which are independent parts from the control member, for supporting the control member and controlling the position of the flat or planar surface of the control member.

It is not easy to manufacture a flattening and leveling jig having a control portion and leg portions integral with the control portion and protruding from the flat surface thereof, by grinding a material which is difficult to be cut or machined, such as ceramics. Particularly, it is difficult to maintain the flatness of the flat or planar surface at a high level.

Thus, according to the present invention, the control member and the leg members are formed from independent parts so that the manufacture of the jig can be easy. That is, in case of the jig of this invention, the control member can be formed or produced solely or independently, so it becomes possible to use as a material for the flattening and leveling jig for flattening the tops of the solder bumps, ceramics or the like which are suitable in that, for example, ceramics are small in the coefficient of thermal expansion and solders do not stick or adhere to the ceramics with ease. Furthermore, the process of making higher the flatness of the flat or planar surface of the control member can be done with ease since the control member can be processed under a condition of not being provided with the leg members. Further, regarding the leg members, the material for the leg members can be selected by consideration on only the characteristics or properties required for the leg members, so an advantage is that not only the manufacture of the flattening and leveling jig can be easy but the manufacturing cost of the circuit board can be decreased. That is, it is not necessary for the leg members to be considered about the sticking or adhering property with respect to solder, so it is not necessary for the leg members to be made of ceramic, and therefore a metal which is easy in working or machining and cheap can, for example, be used as the material for the leg members.

According to a further aspect of the present invention, the flattening and leveling jig has the leg members which are constituent parts independent from the control member and constructed and arranged so as to allow the planar surface of the control member to be parallel to the main surface or joining surface of the substrate when the flattening and leveling jig is disposed in place. Accordingly, by disposing the control member on the substrate by way of the leg members, the flat surface of the control member becomes parallel to the main surface or joining surface of the substrate, so the tops of the solder bumps are formed with flat surfaces parallel to the joining surface of the substrate.

According to a further aspect of the present invention, wire or wire rod can be used as a material for forming the leg members of the flattening and leveling jig. The wire rod can be a round rod or square rod. Particularly, round wire rod can be obtained and worked with ease, and it is also easy to get a round wire rod of high precision.

According to a further aspect of the present invention, the control member has on the flat surface side a pair of grooves in which the leg members are fitted. Thus, the positioning and fixing of the leg member can attained with ease since it only requires to dispose the leg members in the grooves. Further, the distance between the control member and the circuit board (i.e., the height of the solder bump) can be set variously through adjustment of the depth of the grooves.

Generally, the minimum limit of the diameter of a fine wire which is uniform in diameter and has a desired strength is about 0.3 mm, so in the case of the necessity of forming solder bumps of the height smaller than such a minimum diameter it can be met by forming grooves in the ceramic plate by grinding and fitting the fine wire in the grooves.

In the meantime, the machining for forming grooves in the ceramic material is easy as compared with the machining for forming a projection in the ceramic material, particularly from the point of view of the flatness of the flat surface required to be maintained high, the area to be machined, and the like.

A circuit board and its production method according to the present invention will be described further with respect to examples.

EXAMPLE 1

In this example, a top of a solder bump is flattened and leveled at the time of melting of the solder bump.

In the meantime, description is herein made as to a resinous integrated circuit board for use in mounting thereon an integrated circuit chip (hereinafter referred to simply as circuit board), i.e., a circuit board having solder bumps used for connecting thereto an integrated circuit chip by a flip-chip technology.

Figure 1A:
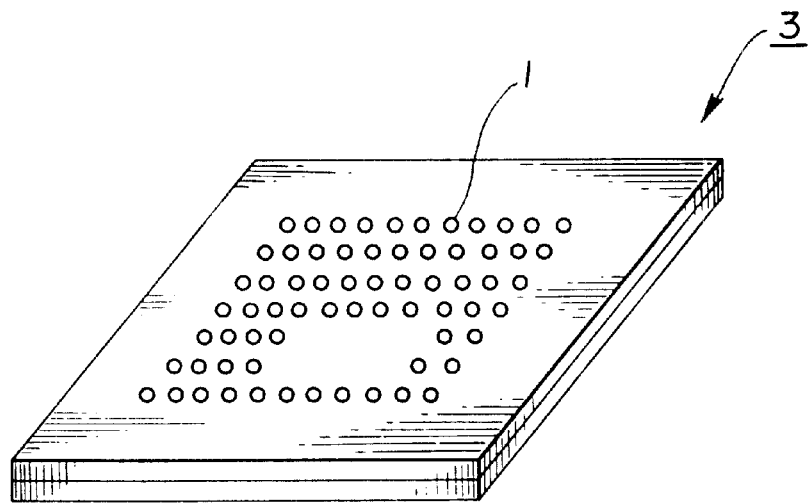
FIG. 1A is a perspective view of a circuit board having solder bumps according to example 1 of the present invention.

As shown in FIG. 1A, a circuit board 3 of this example is a resinous board which is about 25 mm square and about 1 mm thick.

Figure 1B:
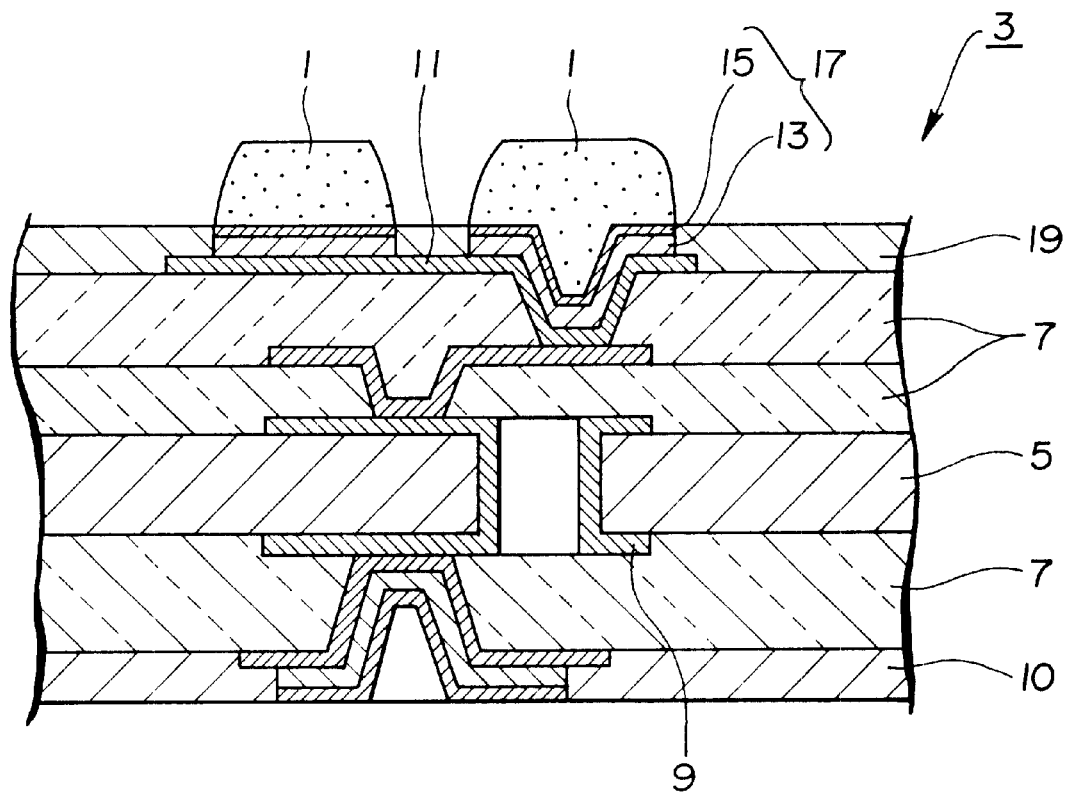
FIG. 1B is an enlarged, fragmentary sectional view of the circuit board of FIG. 1A.

(1) In production of the circuit board 3, as shown in FIG. 1B, insulation layers 7 made of epoxy resin are first formed on a BT (bismaleimide triazine resin) core layer 5 to constitute a substrate, while Cu inner conductive pathways 9 through the insulation layers 7 and the BT core layer 5 being formed by a semi-additive process using a Cu electroless plating or Cu electroplating, and laminated one upon another on the core layer 5. In the meantime, the process of forming the Cu inner wiring can be performed by a subtractive process or a full additive process.

(2) Then, on the outermost surface of the circuit board 3, an about 3 $\mu$m thick Ni—P layer 13 is formed by Ni—P electroless plating for a Cu conductive pathway 11 joined with the Cu inner conductive pathways 9 to be resistance to corrosion and for improving the adhering quality of the same. Further on the Ni—P layer 13, an about 0.1 $\mu$m thick Au layer 15 by Au electroless plating is formed for thereby constituting a base conductive pad or solder bump base pad 17 consisting of the Ni—P layer 13 and the Au layer 15. In the meantime, in other places, a solder resist layer 19 of acrylic resin or epoxy resin is formed.

In the meantime, the above described plating process is the same as a well-known plating process used for a multi-layer printed circuit board as for example disclosed in "365 steps for Multi-layer Printed Circuit Board" written by Fujihira and Fujimori and published by Association of Industrial Research, so the detailed description thereto is omitted for brevity.

(3) Then, as schematically shown in FIG. 2A, on the pad 17 formed on the surface (joining surface) of the circuit board 3 and having been plated, a solder eutectic paste of 36Pb-64Sn (melting point is about 183° C.) is printed by using a metal mask (not shown) and in such a manner as to cover the pad 17 entirely, whereby to form a paste layer 21. In the meantime, the pad 17 is about 150 $\mu$m in diameter, the opening diameter of the metal screen is 200 $\mu$m, and the thickness of the mask is 70 $\mu$m.

(4) Then, a flattening and leveling jig 23 is set to cover all of the paste layers 21. The flattening and leveling jig 23 is made of, for example, ceramic such as silicon nitride and having a control portion 23a in the form of a flat or planar plate and of such a length extending over the paste layers 21 and leg portions 23b disposed at the opposite ends of the control portion 23a and having the same height. The flattening and leveling jig 23 is thus constructed to have a U-like cross section. The bottom surface (planar surface) 23c of the recessed portion of the flattening and leveling jig 23 is ground accurately so as to be 0.1 µm/mm in the flatness.

The length (height) of the leg portions 23b is set so that the planar surface 23c is put in contact with the upper surface of the paste layer 21 or a little distant from same (h=50 µm, for instance). That is, the length is set so as to control or adjust the height of the top of the solder bump 1 to a predetermined value by making a mass of solder tending to become spherical when heated to melt and formed into a solder bump as will be described hereinafter, contact at the top with the planar surface 23c.

(5) Then, the circuit board 3 and the flattening and leveling jig 23 in the state of the latter being installed on the former, is disposed in a furnace (not shown) for reflowing and are heated up to the temperature higher than the melting point (183° C. in this case) by 10 to 40° C. and thereafter cooled. By this, the circuit board 3 having the solder bumps 1 shown in FIGS. 1A and 1B is completed.

In the meantime, the area in which the solder bumps 1 are formed is rectangular, and 12 mm long and 17.5 mm wide.

The flattened top of the solder bump 1 which was obtained by the above described method (i.e., the flattened portion of top) was 80 to 140 µm in diameter. Further, the coplanarity of the solder bump was 7 µm and its value per unit length was 0.33 (=7/21.2) µm /mm.

In the meantime, in case the flattening and leveling jig 23 was not used as heretofore, the coplanarity of the solder bump was 21 µm and its value per unit length was 1.0 µm/mm.

In this manner, according to the present invention, by disposing the flattening and leveling jig 23 having the control portion 23a and the leg portions 23b, at a predetermined position on the paste layers 21, the tops of the solder bumps 1 can be flattened and leveled all at once.

Further, the detection on the position of the top of the solder bump 1 can be easy, so there is produced such an effect in that the measurement of the coplanarity is simplified.

Furthermore, all of the tops of the solder bumps 1 are flattened and leveled by one planar surface 23C at the time when the solder is in a melted state, the coplanarity can be made small, and thus the joining property of a circuit board 3 and an integrated circuit chip or a printed circuit board can be made higher or improved, while it becomes possible to perform the conduction test, insulation test, and the like assuredly.

Particularly, since flattened and leveled all at once by the planar surface 23C, the tops of the solder bumps are formed after the shape of the planar surface 23C, even if the circuit board is bent or curved for some reason, while allowing the difference in height of the pads 17 due to the warp or curvature of the substrate to be absorbed in the process of flattening and leveling which is carried out through melting of solder (refer to FIG. 2B). Accordingly, from this point, a pronounced effect that the coplanarity is lowered is produced.

Actually, in this example, it was observed that the warp or curvature of the circuit board 3 was about 13 µm per 21.2 mm that was the maximum distance between the solder bumps 1. However, as mentioned above, the coplanarity of the solder bump 1 was restricted to 7 µm, so it will be seen that this example makes it possible to absorb the warp or curvature of the circuit board 3 and make lower the coplanarity.

Further, only by changing the height of the leg portions 23b of the flattening and leveling jig 23, it becomes possible to set the height of the solder bump 1 to a desired value with ease.

In the meantime, when the circuit board 3 produced in the above described manner by using the flattening and leveling jig 23 was heated again to reflow the solder bumps, the reflowed solder bumps became spherical by the effect of the surface tension so that the flattened portions at the tops thereof were lost while the tops (the highest portion) increased in height. The variation was that the height of 45 to 55 µm before heating varied to 75 to 105 µm after heating, so increase in height of 30 to 50 µm was observed with respect to each solder bump.

This shows that when the circuit board 3 of this example and its mating integrated circuit chip or printed circuit board are placed on upon another for joining thereof the both can be joined favorably even if there are some pairs of solder bumps 1 and their joining objects (i.e., pads or the like) which are out of contact from each other due to the warp or the like of the joining or mating object of the circuit board 3. This is because when the solder is heated to reflow the tops of the solder bumps 1 become higher and are made to contact the mating pads.

Accordingly, speaking with respect to the above described example, if the variation in the curvature or height in the area where the mating pads to be joined are formed is equal to or smaller than 30 µm, joining of the pads to the circuit board 3 can be done favorably by absorbing the variations in the positions of the mating pads in the direction of the height thereof, so it will be understood that the circuit board 3 is quite excellent in the joining ability.

For the characteristics of the solder bumps 1 it is desired that the height of the tops increases as large as possible, and further for the purpose of lowering the insulation property it is desired that any solder ball and solder bridge that lower the insulation property or ability are not caused. To this end, it will do to make the diameter of the flattened surface of the solder bump 1 be equal to that of the pad 17, and it is further desirable to make the height of the solder bump 1 be smaller than the diameter of the pad 17.

EXAMPLE 2

Description will be made to example 2. By this example, the top of the solder bump is flattened by a press. In the meantime, description similar to that of example 1 will be omitted or simplified for brevity.

(1) By using the similar materials to example 1 and the processes similar to the above described processes (1) to (3) of same, masses of solder paste are applied to the respective pads on the circuit board by printing.

Figure 3:
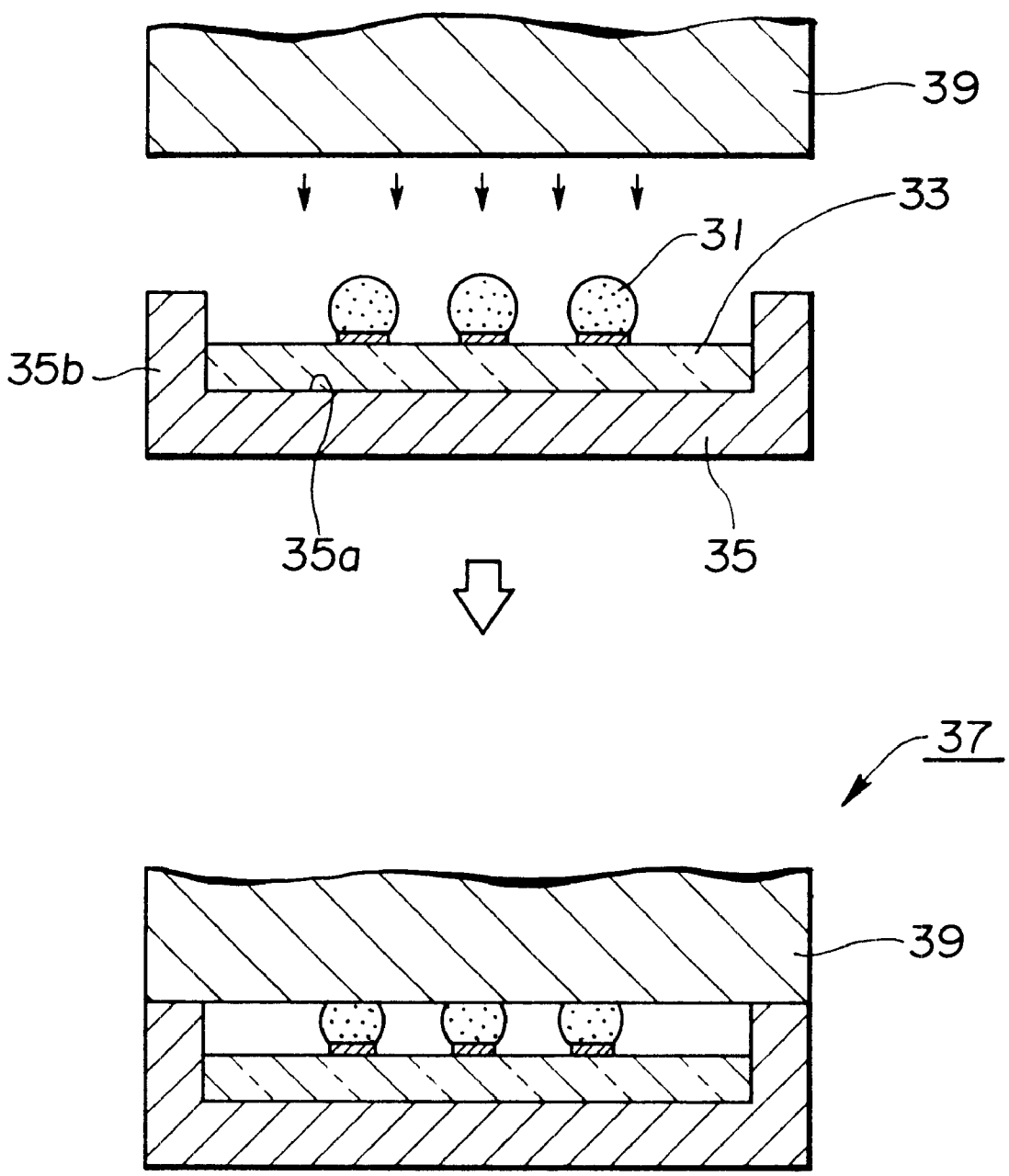
FIG. 3 is an illustration of a process of producing solder bumps according to example 2 and example 3 of this invention.

(2) The circuit board to which the masses of solder paste are applied by printing is disposed in a furnace for reflowing similarly to the conventional method and heated up to a temperature higher than the melting point of the solder by 10 to 40° C. and thereafter cooled. By this, a circuit board 33 having nearly spherical solder bumps 31 as shown in FIGS. 3 and 4A is obtained.

(3) Then, the circuit board 33 having the solder bumps 31 is disposed in a lower jig 35 having a U-like cross section and made of stainless steel. In the meantime, the height of the solder bumps 31 is equal to the result of the depth of a recessed portion 35a of the lower jig 35 (e.g., 1.05 mm) minus the thickness of the circuit board 33 (e.g., 1.00 mm), so the height of the side wall 35b or the depth of the recessed portion 35a is set in proportion to the desired height of the solder bumps 31.

(4) Then, a stainless steel upper pressing plate 39 of a pressing device 37 is let to go downward to press the tops of the solder bumps 31 under pressure of 5 kg/cm$^2$ for one minute and make them flattened. In the meantime, both of the upper pressing plate 39 and the recessed portion 35a of the lower jig 35 are of the flatness of 0.15 μm/mm.

Figure 4A:
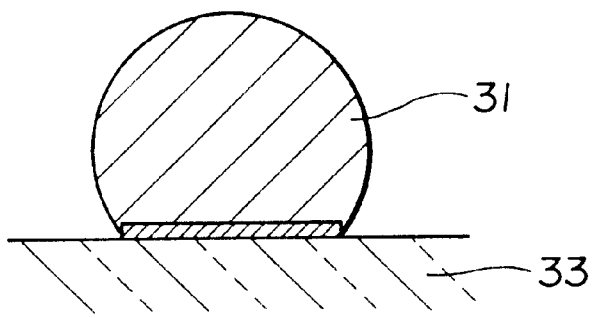
FIG. 4A is a sectional view of a solder bump before processed by pressing.
Figure 4B:
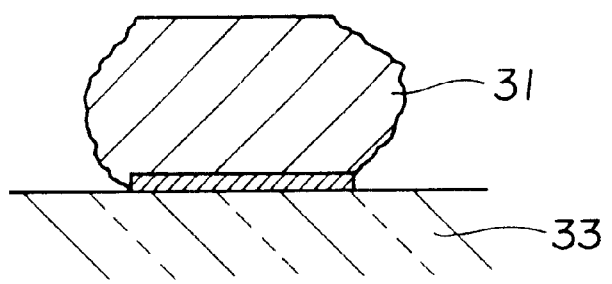
FIG. 4B is a view similar to FIG. 4A but shows the solder bump after processed by pressing according to example 2.

By this, the tops of the solder bumps 31 having been nearly spherical before pressing as shown in FIG. 4A and having been 21 μm in coplanarity were flattened as shown in FIG. 4B, so that a circuit board 33 having solder bumps 31 whose coplanarity was 10 μm and whose coplanarity per unit length was 0.47 μm/mm was obtained. In the meantime, this production method is characterized by fine wrinkles or folds formed in the peripheral portion of the solder bump 31 adjacent the top.

In this manner, according to the present invention, it becomes possible to form a plurality of solder bumps 31 whose tops are flattened, all at once by pressing the tops of the solder bumps 31 which have been once melted and formed into a spherical shape.

Due to this, similarly to example 1, an effect that measurement of the coplanarity is simplified can be produced. In the meantime, in the event that the circuit board 33 is warped or curved, the circuit board 33 is formed after the flat or planar surface of the recessed portion 35a and flattened. Then, when the upper pressing plate 39 is returned to its upper position, there may occur such a case in which the circuit board 33 recovers a little its warp or curvature. However, the coplanarity is still smaller than before, thus making it possible to improve the joining ability of the circuit board 33 while making it possible to perform the insulation test or the like assuredly.

Further, only by changing the depth of the recessed portion 35a of the lower jig 35, the height of the solder bump 31 can be set to a desired value with ease.

A still advantage of this example is that the work is easy since it can be fulfilled simply by pressing.

EXAMPLE 3

Example 3 will be described hereinafter. This example is similar in flattening the tops of the solder bumps by means of a press to the above described example 2 and differs in adding heat at the time of pressing. In the meantime, similar part of description to example 2 is omitted or simplified for brevity. Further, the same reference numerals are used.

(1) By way of the above described processes (1), (2) and (3) of example 2, the printed circuit board 33 having solder bumps 31 is accommodated in the lower jig 35 as shown in FIG. 3.

(2) Then, the pressing device 37 and the lower jig 35 are surrounded by a heat-insulating material so as to be within an enclosed space through which nitrogen gas is made to flow at the flow rate of 100 liter/min. Under this condition, the pressing upper plate 39 heated up to about 200° C. is let to go downward to press the tops of the solder bumps 31 with a pressing pressure of 5 Kg/cm$^2$ for one minute while heating and softening the same for thereby flattening the tops. In the meantime, a heater (not shown) is disposed inside the pressing upper plate 39 so that the pressing upper plate 39 is heated by the heater so as to be held at a temperature higher than the melting point of the solder by 20 to 60.

Figure 4C:
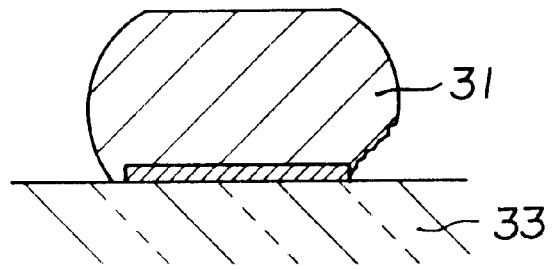
FIG. 4C is a view similar to FIG. 4A but shows the solder bump after processed by pressing according to example 3.

By this, the tops of the solder bumps 31 were depressed or flattened as shown in FIG. 4A, and the printed circuit board 33 having the solder bumps 31 whose coplanarity was 7μm and whose coplanarity per unit length was 0.33 μm/mm, as shown in FIG. 4C, was obtained.

In the meantime, this production method is characterized in that the periphery of the solder bump 31 adjacent the top is not formed with such fine wrinkles or folds as in example 2.

In this manner, by this example, it becomes possible to form a plurality of solder bumps 31 whose tops are flattened and whose peripheries adjacent the tops have no wrinkles or folds by pressing the solder bumps 31 which have been made to melt once and became spherical, all at once by means of the pressing upper plate 39 heated up to a temperature higher than the melting point of the solder.

For this reason, the example 3 can produce substantially the same effect as the example 2 and can make the coplanarity quite smaller similarly to the example 1 since the solder bumps 31 are heated and then flattened.

Further, since the solder bumps 31 are heated and pressed to be flattened, it becomes possible to prevent oxidation due to stress or strain resulting from pressing while being possible to prevent oxidation by heating since nitrogen gas or the like inactive gas is let to flow at the time of pressing.

EXAMPLE 4

Example 4 is for flattening the top of the solder bump by surface grinding. In the meantime, similar description to example 1 will be omitted or simplified for brevity.

(1) By using similar materials to example 1 and processes similar to the processes (1), (2) and (3) of same, a solder paste is applied to a circuit board by printing.

(2) Then, the circuit board to which solder paste is applied by printing is disposed in a furnace for reflowing, similarly to the conventional method and heated up to a temperature higher than the melting point of the solder by 10 to 40° C. and thereafter cooled. By this, a circuit board 43 having nearly spherical solder bumps 41 as shown in FIG. 5 is obtained.

(3) Then, the circuit board 43 having such solder bumps 41 is placed on a sucking plate (i.e., a plate to which an object is adhered by suction) 47 and adhered thereto by suction by decreasing the atmospheric pressure on the lower side of the sucking plate.

(4) Then, a grinding wheel 51 of a grinding machine 49, specifically, an abrasive disk of the grain size of 1000 and of the flatness of 0.2 μm/mm is let to go downward at the speed of 0.2 mm/sec whilst being driven to rotate at the speed of 120 rpm, whereby to grind and make flat and leveled the tops of the solder bumps 41. In this example, for the circuit board which was 1 mm thick, the grinding wheel 51 was let to go down to the level which was 1.05 mm distant from the upper surface of the sucking plate 47.

By this, a circuit board 43 having solder bumps 41 whose coplanarity was 10 μm and whose coplanarity per unit length was 0.47 μm/mm was obtained through grinding of the solder bumps 41 which, before being ground, was nearly spherical and whose coplanarity was 30 μm.

In this manner, according to the present invention, it becomes possible to form a plurality of solder bumps 41 whose tops are flattened, all at once by grinding the tops of the solder bumps 41 having been once molten and become spherical.

For this reason, this example can produce substantially the same effect as example 2, and has an advantage that by simply setting the position to which the grinding wheel 51 is let to go down the height of the solder bump 41 and the diameter of the flat portion at the top can be changed or altered with ease.

In the meantime, although either of the dry type or wet type grinding method can be used in this example, either of them requires to clean or wash the printed circuit board after grinding since ground metal particles and the like adhere or stick to the surface of the printed circuit board in either method.

EXAMPLE 5

In this example, description will be made only to a flattening and leveling jig for use in manufacturing a circuit board having solder bumps. In the meantime, similar description to example 1 will be omitted or simplified for brevity.

As shown in FIG. 12, a flattening and leveling jig 61 used for this example is constructed of a control member 63 in the form of a flat plate and a pair of leg members 65 disposed oppositely on the lower side of the control member 63.

The above described control member 63 is an alumina ceramic plate which is 25 mm square and 2 mm thick, and its one side surface (a surface used for flattening tops of solder bumps, and a lower surface in FIG. 12A) is grounded. The grounded side surface 63*a* is formed with a pair of grooves 63*b* which is 25 mm long, 0.4 mm wide and 0.25 mm deep, at locations about 2 mm distant from the opposite ends, respectively.

The leg members 65*b* are fitted in the grooves 63*b* in such a manner as to be buried half and are constituted by a round stainless steel wire of 0.3 mm in diameter. In the meantime, it is desired to bend the opposite ends of the stainless steel wire upward and inward of the control member 63 as shown in FIG. 12C for the purpose of preventing removal of the leg members 65 from the control member 63.

In the structure in which the leg members 65 are fitted in the grooves 63*b*, the leg members 65 are adapted to protrude a little (50 µm) from the planar surface 63*a*, so it becomes possible to set the distance between the control member 63 and the circuit board (i.e., the height of solder bump) to 50 µm, i.e., 0.3 mm (diameter of stainless steel wire) minus 0.25 mm (depth of groove).

The flattening and leveling jig 61 used in this example is constructed so that the control member 63 and the leg members 65 which are independent constituent parts, so its manufacture is easy since it does not require machining of an alumina ceramic flat plate which is a material quite difficult of being machined, for forming the alumina ceramic flat plate into such a shape that the legs 65 protrude from the flat plate 63, but only requires cutting of grooves 63, so the machining of the jigs 61 is easy.

Particularly, in this example, the surface 63*a* used for pressing the tops of the solder bumps is constituted by the planar surface of the plat member, so machining for making the surface 63*a* flat or planar is easy and furthermore its flatness is high. For this reason, this example can make the coplanarity smaller.

Test was conducted with respect to example 5. In this test, a flattening and leveling jig having a control member made of alumina ceramic and leg members made of stainless steel wire which were independent constituent parts as in example 5 was produced, while producing a flattening and leveling jig made of alumina ceramic in which a control member and leg members were integral with each other as a comparative example, and by using them flattening of the tops of solder bumps was actually performed.

By this test, it was revealed that in case of the example of this invention the flatness was 0.05 µm/mm, days required for manufacture were three days and the coplanarity of solder bumps was 0.2 µm/mm, i.e., the jig of this example was favorable since its manufacture was easy and the coplanarity was small. However, in case of the comparative example, the flatness was 0.10 µm/mm, 6 days required for manufacture were six days and the coplanarity of solder bumps was 0.4 µm/mm, so the comparative example was not favorable since its manufacture was difficult and the coplanarity was large. Furthermore, in case of the comparative example, its cost (manufacturing cost of the flattening and leveling jig) was twice as high as that of the example of this invention.

Figure 14A:
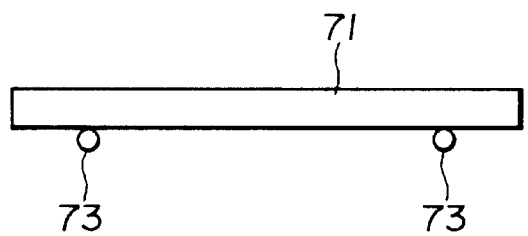
FIG. 14A is a sectional view of a variant of the flattening and leveling jig of FIGS. 12A to 12C.
Figure 14B:
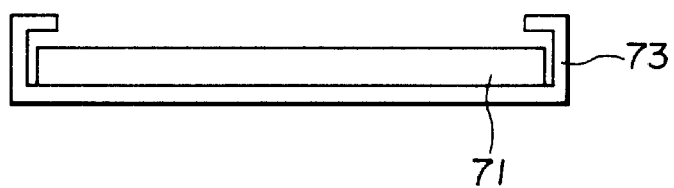
FIG. 14B is a side elevation of the flattening and leveling jig of FIG. 14A.
Figure 15A:
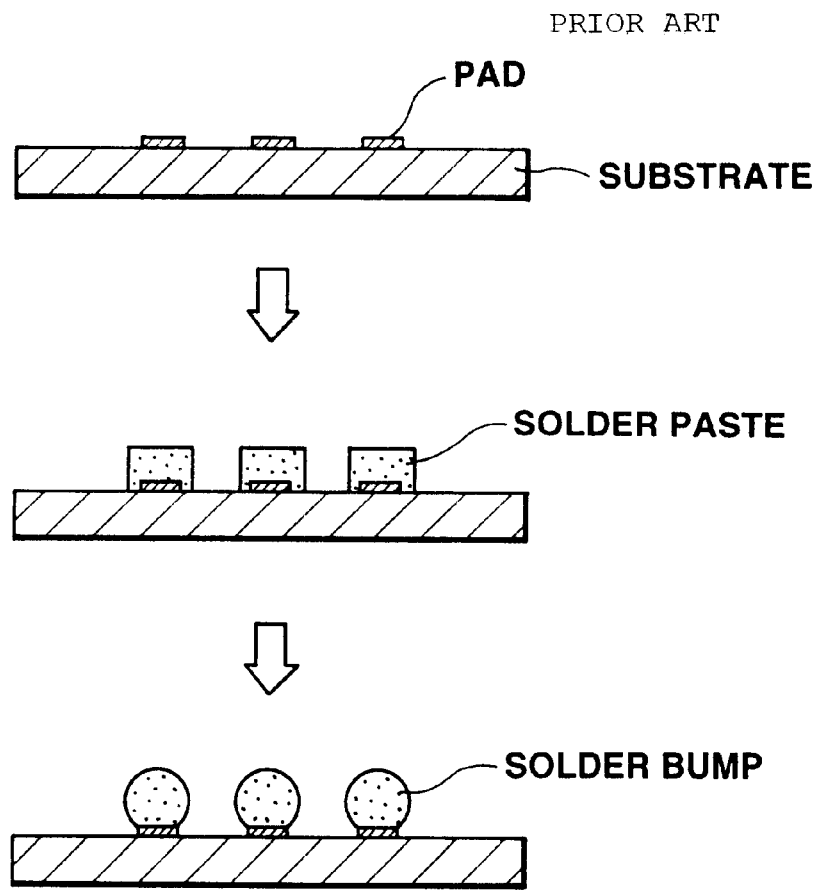
FIGS. 15 A and 15B are illustrations of a prior art.
Figure 15B:
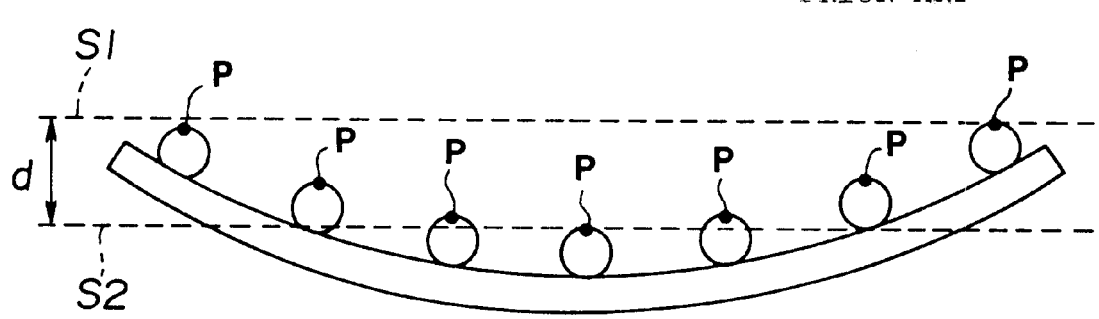

In the meantime, while in the above described examples the grooves are formed in a control member for fittingly receive therein the leg members, it will do not to form the grooves in case the height of the leg members is large to some extent (e.g., 0.3 mm or more) but to dispose the stainless steel wire just on the lower side of the control member 71 to serve as the leg members as shown in FIG. 14.

In this instance, since it is not required to form the grooves, the flattening and leveling jig can be produced more easily. In the meantime, by changing the diameter of the stainless steel wire, the height of the solder bumps can be set freely.

The present invention is not limited to the above described examples but various modifications and variations may be made thereto without departing from the subject matter of this invention.

(1) For example, as a material for a substrate of a printed circuit board, it can be employed other than plastics (resin), ceramics such as alumina or the like, a composite material comprised of resin and glass fiber or the like, a composite material comprised of resin and ceramics or the like.

(2) In the above described examples, description is made as to solder bumps for joining an integrated circuit chip to a circuit board by flip-chip technology. However, this invention is not limited to this but can be applied to such solder bumps for joining the circuit board to a printed circuit board such as motherboard or to a BGA substrate in which solder bumps are disposed so as to form a grid pattern or checkered pattern.

(3) The solder used can be of any type such as a high melting point solder containing 90% Pb and a solder containing Ag or In, which is selected depending upon usage. Further, the flux contained in the solder can be any one of the R type, RMA type and RA type (in the order of smaller reduction ability or property). In the meantime, the material of the bumps herein used can be, other than Pb—Sn solder which is usually called soft solder, Au—Sn alloy, Au—Si alloy or the like.

(4) The technology used for applying the solder material to the pads, can be, other than the above described technology of printing of paste, a technology of dropping solder paste by the use of a dispenser, a technology of mounting a preform, pellet and solder balls, or the like.

As having been described above, the circuit board of this invention has solder bumps whose tops are flattened.

Accordingly, it becomes possible to make smaller the coplanarity of the solder bumps and improve the joining ability of the printed circuit board. Further, a pronounced effect of this invention is that the examination or inspection about the insulation or the like can be done with efficiency and measurement of the coplanarity can be simplified Further, a method of producing a circuit board having solder bumps according to the present invention, can produce an excellent effect that the circuit board having the above described excellent characteristics can be produced with ease by a simple step of melting the solder and pressing the same after cooling, which step is performed by using a control member, or by a simple step of grinding the solder after molted and cooled.

Particularly, in case the solder is melted by using a control member, there results an excellent advantage, i.e., decreased coplanarity, simplified manufacturing steps, prevention of solder bump oxidation, etc.

Further, the flattening and leveling jig of this invention can be produced with ease even when a material which has a difficulty in machining but is suitable for use in flattening the tops of the solder bumps, is used, thus making it possible to reduce the manufacturing cost in manufacture of a circuit board having solder bumps. Further, cutting or forming a flat or planar surface on the control member can be done with ease, thus making it possible to decrease the manufacturing cost of the flattening and leveling jig while making lower the coplanarity of the solder bumps.

What is claimed is:

1. A circuit board produced by the process of:

preparing a substrate having a joining surface;

disposing a plurality of masses of solder paste on the joining surface of the substrate;

heating and melting the masses of solder paste, thereby forming the masses of solder paste into a plurality of solder bumps on the joining surface of the substrate; and flattening and levelling tops of the solder bumps, thereby making smaller a coplanarity of the solder bumps;

wherein the joining surface of the substrate has at least one curved portion in which at least one of the plurality of solder bumps is disposed on the at least one curved portion; and wherein, prior to the flattening and levelling step, tops of the plurality of solder bumps are not coplanar with each other due at least in part to the at least one curved portion.

2. A circuit board according to claim 1, wherein said flattening and levelling comprises pressing a flat surface of a jig against the tops of the solder bumps.

3. A circuit board according to claim 1, wherein said flattening and levelling comprises grinding the tops of the solder bumps.

4. A circuit board according to claim 1, wherein a coplanarity per unit length of the solder bumps is 0.5 (m or less.

5. A circuit board according to claim 1, wherein circular pads are interposed between the respective solder bumps and the substrate, and the tops of the solder bumps are circular and smaller in diameter than the pads.

6. A circuit board according to claim 1, wherein circular pads are interposed between the respective solder bumps and the substrate, the tops of the solder bumps are nearly equal in diameter to the pads, and the height of the solder bumps is smaller than the diameter of the pads.

7. A circuit board produced by the process of:

preparing a substrate having a joining surface;

disposing a plurality of masses of solder paste on the joining surface of the substrate;

disposing a jig so that a flat surface of the jig is located at a predetermined position above the masses of solder paste; and heating and melting the masses of solder paste to bring tops of the masses of solder paste into contact with the flat surface of the jig, thereby forming the masses of solder paste into solder bumps having tops that are flattened and leveled in such a way as to make smaller a coplanarity of the solder bumps;

wherein the joining surface of the substrate has at least one curved portion in which at least one of the plurality of solder bumps is disposed on the at least one curved portion; and wherein, prior to the heating and melting step, tops of the plurality of solder bumps are not coplanar with each other due at least in part to the at least one curved portion.

8. A circuit board according to claim 7, wherein a coplanarity per unit length of the solder bumps is 0.5 (m or less.

9. A circuit board according to claim 7, wherein circular pads are interposed between the respective solder bumps and the substrate, and the tops of the solder bumps are circular and smaller in diameter than the pads.

10. A circuit board according to claim 7, wherein circular pads are interposed between the respective solder bumps and the substrate, the tops of the solder bumps are nearly equal in diameter to the pads, and the height of the solder bumps is smaller than the diameter of the pads.

11. A method of producing a circuit board comprising:

preparing a substrate having a joining surface;

disposing of a plurality of masses of solder paste on the joining surface of the substrate;

heating and melting the masses of solder paste, thereby forming the masses of solder paste into a plurality of solder bumps on the joining surface of the substrate; and flattening and levelling tops of the solder bumps thereby making smaller a coplanarity of the solder bumps, wherein the joining surface of the substrate has at least one curved portion in which at least one of the plurality of solder bumps is disposed on the at least one curved portion, and wherein, prior to the flattening and levelling step, tops of the plurality of solder bumps are not coplanar with each other due at least in part to the at least one curved portion.

12. A method according to claim 11, wherein said flattening and levelling comprises pressing a flat surface of a jig against the tops of the solder bumps.

13. A method according to claim 11, wherein said flattening and levelling comprises grinding the tops of the solder bumps.

14. A method of producing a circuit board comprising:

preparing a substrate having a joining surface;

disposing a plurality of masses of solder paste on the joining surface of the substrate;

disposing a jig so that a flat surface of the jig is located at a predetermined position above the masses of solder paste; and heating and melting the masses of solder paste to bring tops of the masses of solder paste into contact with the flat surface of the jig, thereby forming the masses of solder paste into solder bumps having tops that are flattened and leveled in such a way as to make smaller a coplanarity of the solder bumps, wherein the joining surface of the substrate has at least one curved portion in which at least one of the plurality of solder bumps is disposed on the at least one curved portion, and wherein, prior to the heating and melting step, tops of the plurality of solder bumps are not coplanar with each other due at least in part to the at least one curved portion.

15. A method according to claim 14, wherein in the step of disposing a jig, the flat surface of the jig is positioned such that the flat surface of the jig is not in contact with any of the masses of solder paste.

\* \* \* \* \*